(12) United States Patent
Briere

(10) Patent No.: US 7,745,849 B2
(45) Date of Patent: Jun. 29, 2010

(54) ENHANCEMENT MODE III-NITRIDE SEMICONDUCTOR DEVICE WITH REDUCED ELECTRIC FIELD BETWEEN THE GATE AND THE DRAIN

(75) Inventor: Michael A. Briere, Woonsocket, RI (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/234,782

(22) Filed: Sep. 22, 2008

(65) Prior Publication Data

US 2009/0078964 A1 Mar. 26, 2009

Related U.S. Application Data

(60) Provisional application No. 60/973,935, filed on Sep. 20, 2007.

(51) Int. Cl.
*H01L 29/205* (2006.01)
(52) U.S. Cl. .................. 257/192; 257/183
(58) Field of Classification Search ............. 257/192, 257/12, 183
See application file for complete search history.

(56) References Cited

U.S. PATENT DOCUMENTS 3,697,786 A * 10/1972 Smith ......................... 327/581

2006/0118809 A1 * 6/2006 Parikh et al. ................ 257/103
2007/0235775 A1 * 10/2007 Wu et al. ..................... 257/288
2007/0278518 A1 * 12/2007 Chen et al. .................. 257/192

OTHER PUBLICATIONS

Monolithic Integration of Enhancement-and Depletion-mode AlGaN/GaN HEMTs for GaN Digital Integrated Circuits—Yong Cai et al.—Dept. of Electrical and Electronic Engineering, Hong Kong University of Science and Technology, Hong Kong—4 pages.
Self-aligned Enhancement-Mode AlGaN/GaN HEMTs Using Fluoride-based Plasma Treatment—Yong Cai et al.—Dept. of Electrical and Electronic Engineering Hong Kong University of Science and Technology, Hong Kong—179-180.
High-Performance Enhancement-Mode AlGaN/GaN HEMTs Using Fluoride-based Plasma Treatment—Yong Cai et al.—IEEE Electron Device Letters, vol. 26, No. 7—Jul. 2005—pp. 435-437.
Enhancement-Mode AlGaN/GaN HEMTs on Silicon Substrate—Shuo Jia et al. IEEE Transactions on Electron Devices, vol. 53, No. 6, Jun. 2006—pp. 1471-1477.
Reliability of Enhancement-mode AlGaN/GaN HEMTs Fabricated by Fluorine Plasma Treatment—Congwen Yi et al.—Dept. of Electronic and Computer Engineering, Hong Kong University of Science and Technology, Hong Kong—pp. 389-392.
Planar Integration of E/D-Mode AlGaN/GaN HEMTs using Fluoride-Based Plasma Treatment—Ruonan Wang et al.—IEEE Electron Device Letters, vol. 27, No. 8, Aug. 2006—pp. 633-635.

(Continued)

*Primary Examiner*—Thao P. Le
(74) *Attorney, Agent, or Firm*—Farjami & Farjami LLP

(57) ABSTRACT

An enhancement mode III-nitride heterojunction device that includes a region between the gate and the drain electrode thereof that is at the same potential as the source electrode thereof when the device is operating.

18 Claims, 2 Drawing Sheets

OTHER PUBLICATIONS

Control of Threshold Voltage of AlGaN/GaN HEMTs by Fluoride-Based Plasma Treatment: From Depletion Mode to Enhancement Mode—Yong Cai et al.—IEEE Transactions on Electron Devices, vol. 53, No. 9, Sep. 2006—pp. 2207-2215.

Normally Off AlGaN/GaN Low-Density Drain HEMT (LDD-HEMT) With Enhanced Breakdown Voltage and Reduced Current Collapse—Di Song et al.—IEEE Electron Device Letters, vol. 28, No. 3, Mar. 2007—pp. 189-191.

High-Breakdown Enhancement-Mode AlGaN/GaN HEMTs with Integrated Slant Field-Plate—C.S. Suh et al.—Electrical and Computer Engineering Department—3 pages.

* cited by examiner

ENHANCEMENT MODE III-NITRIDE SEMICONDUCTOR DEVICE WITH REDUCED ELECTRIC FIELD BETWEEN THE GATE AND THE DRAIN

RELATED APPLICATION

This application is based on and claims priority to U.S. Provisional Application Ser. No. 60/973,935, filed on Sep. 20, 2007, entitled Enhancement Mode III-Nitride Semiconductor Device with Reduced Electric Field Between the Gate and the Drain, to which a claim of priority is hereby made and the disclosure of which is incorporated by reference.

FIELD OF INVENTION

The present application relates to semiconductor devices and methods of fabrication of semiconductor devices.

DEFINITION

As referred to herein III-nitride refers to a semiconductor alloy from the InAlGaN system, including, but not limited to, GaN, AlGaN, AlN, InGaN, InAlGaN, and the like.

BACKGROUND AND SUMMARY OF THE INVENTION

Depletion mode devices are normally ON, while enhancement mode devices are normally OFF. Depletion mode III-nitride heterojunction power semiconductor devices such as III-nitride high electron mobility transistors (BEMTs) are well known.

For various reasons, e.g. efficiency and simplicity of operation, enhancement mode III-nitride power semiconductor devices are desirable. To obtain an enhancement mode III-nitride heterojunction type power semiconductor device, the carrier-rich region (referred to as the two-dimensional electron gas or 2-DEG) under the gate must be interrupted, whereby the device is rendered normally OFF when no voltage is applied to the gate electrode.

In Control of Threshold Voltage of AlGaN/GaN BEMT by Fluoride-Based Plasma Treatment: From Depletion Mode to Enhancement Mode, Yong Cai, Yugang Zhou, Kei May Lau and Kevin Chen, IEEE Transactions on Electron Devices, Vol. 53, No. 9, September 2006 (Cai et al.) it is taught that using a $CF_4$ process fluoride ions can be embedded in the barrier region of a depletion mode device in order to render the same normally OFF.

In practice, however, a depletion mode III-nitride BEMT which has been turned into an enhancement mode device using the $CF_4$ process is unstable. Specifically, after a period of operation, the threshold voltage of such a device tends to shift back to negative. That is, the device reverts back to depletion mode operation.

It is believed that the electric field between the gate electrode and the drain electrode of a III-nitride power semiconductor device is responsible for the shift of the threshold voltage.

To overcome the drawbacks discussed above, according to one aspect of the present invention, the voltage between the gate and the drain is reduced, whereby a stable enhancement mode III-nitride device, which has been fabricated for example, by using the $CF_4$ process is obtained.

According to one embodiment of the present invention, an enhancement mode III-nitride power device fabricated using the $CF_4$ process is provided with a field plate over the heterojunction which is shorted to the source electrode of the device. As a result, the gate to drain voltage "seen" by the gate electrode is reduced, whereby the device is rendered more stable.

Other features and advantages of the present invention will become apparent from the following description of the invention which refers to the accompanying drawings.

DETAILED DESCRIPTION

Figure 1:
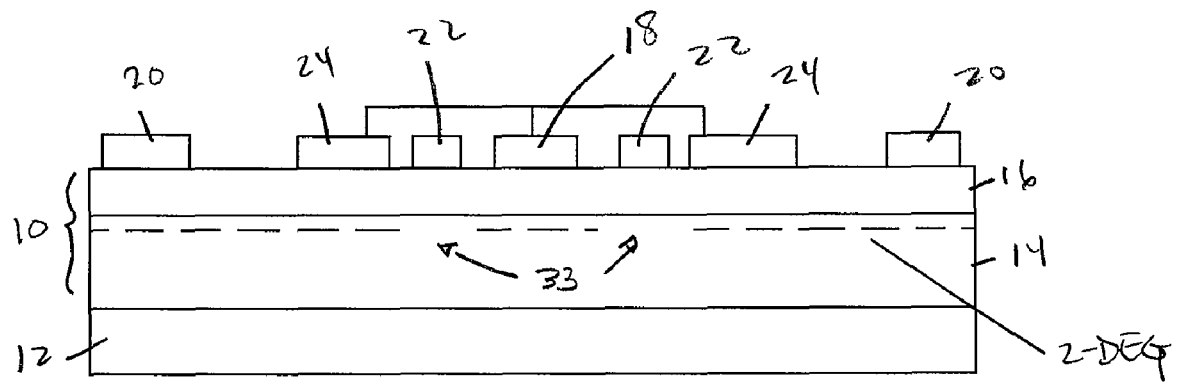
FIG. 1 schematically illustrates a cross-sectional view of two adjacent active cells of a device according to the present invention.

Referring to FIG. 1, a device according to the preferred embodiment of the present invention includes a III-nitride heterojunction 10 formed over a support body 12. Heterojunction 10 includes a first III-nitride body 14 formed over support body 12, and second III-nitride body 16 formed over first III-nitride body 14. The thickness and composition of first and second III-nitride bodies 14, 16 are selected to generate a two-dimensional electron gas (2-DEG) at (near) the heterojunction thereof either inside first semiconductor body 14 or inside second semiconductor body 16, as is well known in the art.

In the preferred embodiment, first III-nitride body 14 serves as the channel layer and may be composed of GaN, and second III-nitride body 16 serves as the barrier layer and may be composed of AlGaN. Support body 12 may be a substrate that is compatible with first III-nitride body 14, e.g. GaN, or may be a substrate (e.g. silicon, SiC or sapphire) that includes a transition layer (e.g. AlN) to allow for the growth thereon of first III-nitride body 14.

A device according to the present invention further includes in each active cell thereof, first power electrode 18 (e.g. source electrode), second power electrode 20 (e.g. drain electrode), and a gate electrode 22 disposed between first power electrode 18 and second power electrode 20. In the preferred embodiment, and as illustrated by FIG. 1, gate electrode 22 makes a schottky contact with second III-nitride body 16. However, it should be understood that a gate electrode 22 may be capacitively coupled to second III-nitride body 16 (e.g. through a gate dielectric) without deviating form the scope and the spirit of the present invention.

In one preferred embodiment of the present invention, second III-nitride body (barrier layer) 16 is processed using the $CF_4$ process (or any other plasma based process) as set forth, for example, in Cai et al. to obtain a negatively charged region directly under the gate which causes the interruption of the 2-DEG directly under the gate in order to render the device normally OFF when no voltage is applied to the gate. Thus, for example, second III-nitride body 16 includes negative charges, e.g. negative Fluorine ions or chlorine ions, under the gate in order to render the device normally OFF when no voltage is applied to gate electrode 22.

According to an aspect of the present invention, a field plate 24 is disposed over second III-nitride body 16 and between a gate electrode 22 and drain electrode 20. Field plate 24 is electrically shorted to source electrode 18 to reduce the voltage between gate electrode 22 and drain electrode 20. Thus, the gate will experience the potential between the gate and the source which may be in the order of 6-7 volts typically. As a result, a stable enhancement mode III-nitride heterojunction power device is obtained. Field plate 24 may be shorted to source electrode 18 through a conductive bus residing on the device, or field plate 24 and source electrode 18 may be shorted outside the device, e.g. through electrically connected pads of a lead frame or a circuit board. Thus, field plate 24 and source electrode 18 would be at the same potential when the device is operating.

Note that field plate 24 may be a metallic body that is schottky coupled to second III-nitride body 16, or may be a conductive semiconductor body such as a highly conductive III-nitride body (e.g. N+GaN or N+AlGaN) as illustrated by FIG. 1.

Figure 2:
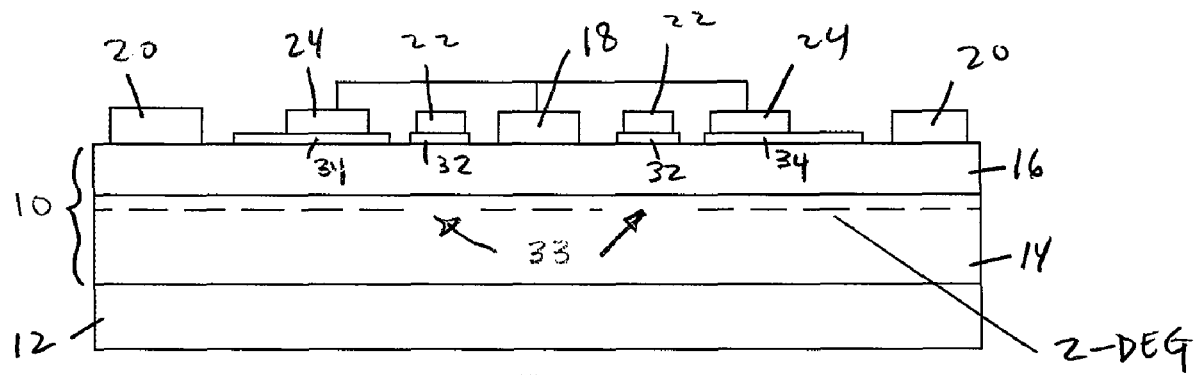
FIG. 2 schematically illustrates a cross-sectional view of two adjacent active cells of a device according to the second embodiment of the present invention.

Referring to FIG. 2, in which like numerals identify like features, in a III-nitride heterojunction power device according to the second embodiment of the present invention, a gate dielectric 32 (e.g. $SiO_2$ or $Si_3N_4$) may be disposed between the gate electrode 18 and body 16. Furthermore, a dielectric body 34 (e.g. $SiO_2$ or $Si_3N_4$) may be disposed between field plate 24 and second III-nitride body 16.

Figure 3:
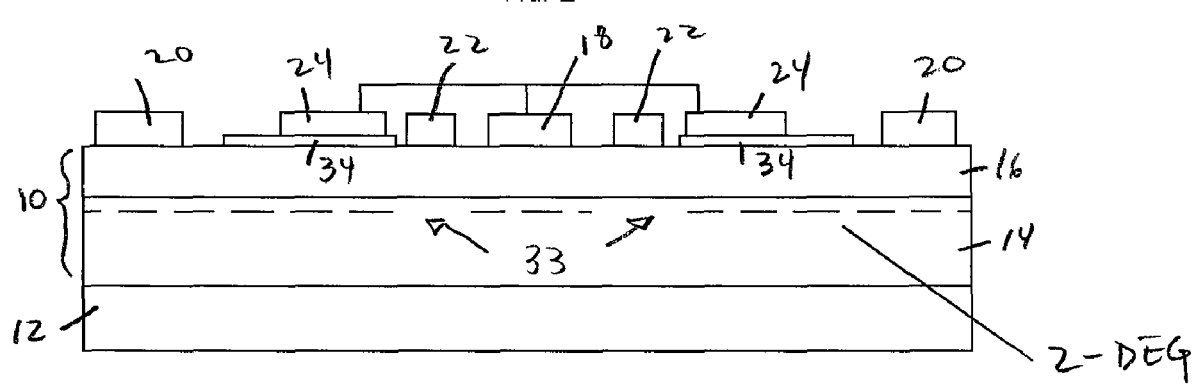
FIG. 3 schematically illustrates a cross-sectional view of two adjacent active cells of a device according to the third embodiment of the present invention.

Referring now to FIG. 3, in which like numerals identify like features, in a III-nitride heterojunction power device according to the third embodiment, gate electrode 22 is schottky coupled to second III-nitride body 16, while field plate 24 is capacitively coupled to second III-nitride body 16 though dielectric body 34.

Figure 4:
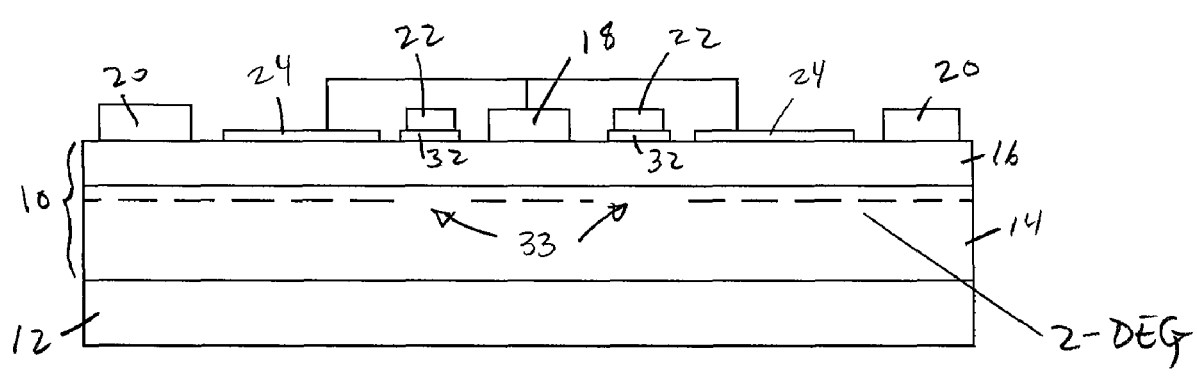
FIG. 4 schematically illustrates a cross-sectional view of two adjacent active cells of a device according to the fourth embodiment of the present invention.

Referring to FIG. 4, in which like numerals identify like features, in a III-nitride heterojunction power device according to the fourth embodiment, gate electrode 22 is capacitively coupled to second III-nitride body 16 through a respective gate dielectric 32, while field plate 24 is schottky coupled to second III-nitride body 16.

Figure 5A:
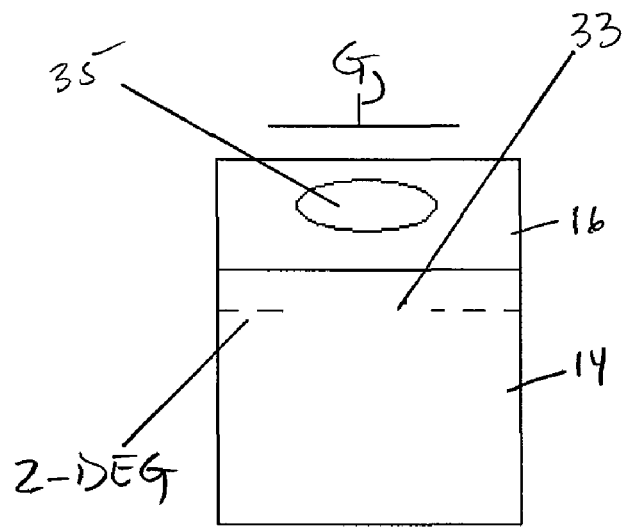
FIG. 5A schematically illustrates a region under the gate of a device according to one configuration.
Figure 5B:
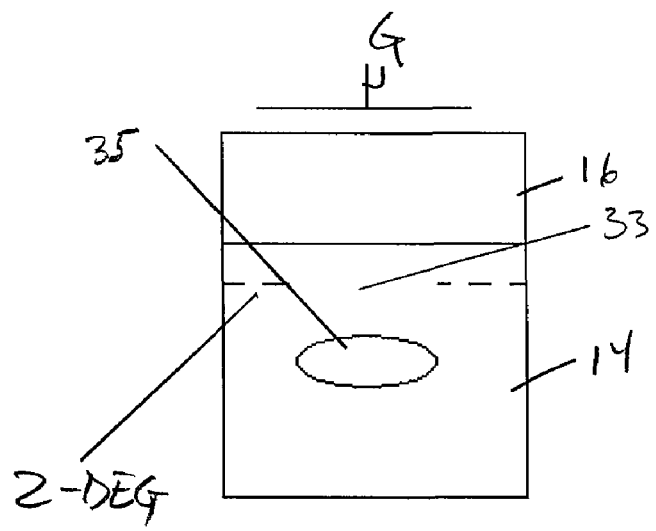
FIG. 5B schematically illustrates a region under the gate of a device according to another configuration.
Figure 5C:
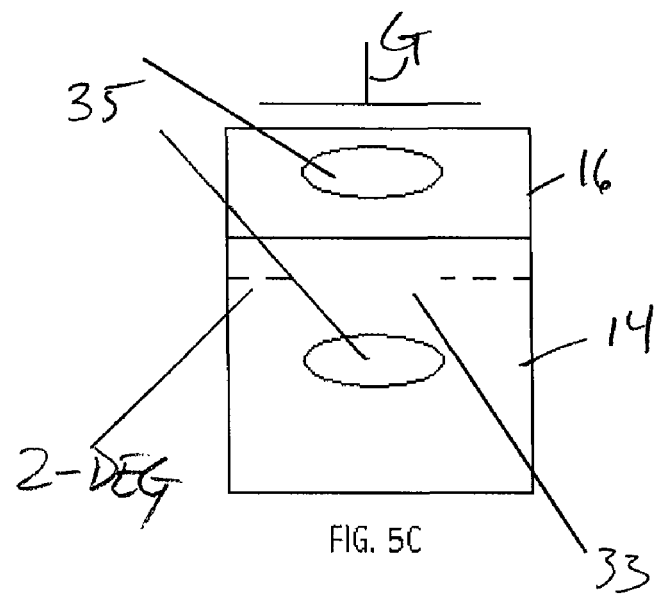
FIG. 5C schematically illustrates a region under the gate of a device according to yet another configuration.

Referring now to FIGS. 5A-5C, to obtain an interrupted region 33 in the 2-DEG in each embodiment, negatively charged region 35, which may include implanted negative ions such as Fluorine ions or Chlorine ions, may be formed directly under the gate G inside second III-nitride body 16 (FIG. 5A), or inside first III-nitride body 14 (FIG. 5B), or inside both first III-nitride body 14 and second III-nitride body 16. The charge in each negatively charged region 35 should be selected to interrupt a portion of the 2-DEG under the gate G when no voltage is applied to the same.

A device according to any of the embodiments of the present invention is suited for power applications, and particularly large current high frequency applications.

One suitable application for devices according to the present invention are in driver circuits, e.g. MOSgate drivers or the like applications.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a III-nitride heterojunction that includes one III-nitride body over another III-nitride body, said one III-nitride body and said another III-nitride body having different bandgaps, whereby a two-dimensional electron gas is generated inside said III-nitride heterojunction;
   a source electrode and a drain electrode both disposed over and coupled to said III-nitride heterojunction;
   a gate electrode coupled to said III-nitride heterojunction;
   a negatively charged region formed in said III-nitride heterojunction directly under said gate electrode; and
   a field plate coupled to said III-nitride heterojunction and disposed completely between said gate electrode and said drain electrode, wherein said field plate is electrically coupled to said source electrode, whereby said field plate is at the same potential as said source electrode when said device is operating.

2. The power semiconductor device of claim 1, wherein said negatively charged region includes negatively charged ions.

3. The power semiconductor device of claim 1, wherein said negatively charged region includes fluorine ions.

4. The power semiconductor device of claim 1, wherein said negatively charged region includes chlorine ions.

5. The power semiconductor device of claim 1, wherein said field plate is schottky coupled to said III-nitride heterojunction.

6. The power semiconductor device of claim 1, wherein said field plate is capacitively coupled to said III-nitride heterojunction through a dielectric body.

7. The power semiconductor device of claim 1, wherein said gate electrode is schottky coupled to said III-nitride heterojunction.

8. The power semiconductor device of claim 1, wherein said gate electrode is capacitively coupled to said III-nitride heterojunction through a gate dielectric body.

9. The power semiconductor device of claim 1, wherein said one III-nitride body is comprised of AlGaN and said another III-nitride body is comprised of GaN.

10. A driver circuit that includes a III-nitride power semiconductor device, said III-nitride power semiconductor device comprising:
    a III-nitride heterojunction that includes one III-nitride body over another III-nitride body, said one III-nitride body and said another III-nitride body having different bandgaps, whereby a two-dimensional electron gas is generated inside said III-nitride heterojunction;
    a source electrode and a drain electrode both disposed over and coupled to said III-nitride heterojunction;
    a gate electrode coupled to said III-nitride heterojunction;
    a negatively charged region formed in said III-nitride heterojunction directly under said gate electrode; and
    a field plate coupled to said III-nitride heterojunction and disposed completely between said gate electrode and said drain electrode, wherein said field plate is electrically coupled to said source electrode, whereby said field plate is at the same potential as said source electrode when said device is operating.

11. The power semiconductor device of claim 10, wherein said negatively charged region includes negatively charged ions.

12. The power semiconductor device of claim 10, wherein said negatively charged region includes fluorine ions.

13. The power semiconductor device of claim 10, wherein said negatively charged region includes chlorine ions.

14. The power semiconductor device of claim 10, wherein said field plate is schottky coupled to said III-nitride heterojunction.

15. The power semiconductor device of claim 10, wherein said field plate is capacitively coupled to said III-nitride heterojunction through a dielectric body.

16. The power semiconductor device of claim 10, wherein said gate electrode is schottky coupled to said III-nitride heterojunction.

17. The power semiconductor device of claim 10, wherein said gate electrode is capacitively coupled to said III-nitride heterojunction through a gate dielectric body.

18. The power semiconductor device of claim 10, wherein said one III-nitride body is comprised of AlGaN and said another III-nitride body is comprised of GaN.

* * * * *